(12) United States Patent
Reid et al.

(10) Patent No.: US 8,457,172 B2
(45) Date of Patent: Jun. 4, 2013

(54) BRAGG GRATING STRUCTURE

(75) Inventors: Douglas Charles John Reid, Rugby (GB); Andrew John Ward, Northampton (GB)

(73) Assignee: Oclaro Technology Limited (GB)

( * ) Notice: Subject to any disclaimer, the term of this patent is extended or adjusted under 35 U.S.C. 154(b) by 321 days.

(21) Appl. No.: 12/889,517

(22) Filed: Sep. 24, 2010

(65) Prior Publication Data

US 2011/0069727 A1   Mar. 24, 2011

Related U.S. Application Data

(62) Division of application No. 12/088,136, filed as application No. PCT/GB2006/050302 on Sep. 22, 2006, now Pat. No. 7,826,508.

(30) Foreign Application Priority Data

Sep. 29, 2005 (GB) .................................. 0519799.1

(51) Int. Cl.
   *H01S 3/08* (2006.01)
(52) U.S. Cl.
   USPC ........................... 372/102; 372/20; 372/50.11
(58) Field of Classification Search
   USPC .................................. 372/20, 50.11
   See application file for complete search history.

(56) References Cited

U.S. PATENT DOCUMENTS

| | | | |
|---|---|---|---|
| 4,746,192 A | 5/1988 | Minagawa | |
| 4,993,032 A | 2/1991 | Bradley | |
| 5,091,916 A | 2/1992 | Crimini et al. | |
| 5,315,436 A | 5/1994 | Lowenhar et al. | |
| 5,633,885 A | 5/1997 | Galvanauskas et al. | |
| 5,668,900 A | 9/1997 | Little et al. | |
| 5,771,250 A | 6/1998 | Shigehara et al. | |
| 5,999,546 A | 12/1999 | Espindola et al. | |
| 6,088,376 A | 7/2000 | O'Brien et al. | |
| 2002/0118711 A1 | 8/2002 | Jacquet | |
| 2004/0125831 A1 | 7/2004 | Fischer | |
| 2004/0208445 A1 | 10/2004 | Mears et al. | |
| 2004/0222364 A1 | 11/2004 | Kenny et al. | |
| 2005/0053102 A1* | 3/2005 | Reid | 372/20 |
| 2005/0088744 A1 | 4/2005 | Smith et al. | |

FOREIGN PATENT DOCUMENTS

| | | |
|---|---|---|
| EP | 0 772 265 | 5/1997 |
| EP | 0 955558 | 2/2001 |
| EP | 1 235 318 | 8/2002 |
| JP | 2001-320127 | 11/2001 |

(Continued)

OTHER PUBLICATIONS

Co-pending U.S. Appl. No. 12/088,136, filed Mar. 26, 2008.

(Continued)

*Primary Examiner* — Dung Nguyen
(74) *Attorney, Agent, or Firm* — Fenwick & West LLP

(57) ABSTRACT

A Bragg grating has a local reflection strength which varies with position along the length of the grating so as to generate a non-uniform wavelength reflection spectrum, enabling compensation for a non-uniform gain profile of the gain section of a tunable laser. In another aspect, a Bragg comb grating is modulated by an envelope function which can also compensate for a non-uniform gain profile. The comb grating may be a phase change grating, with the envelope function shape being controlled by the length between phase changes and/or size of the phase changes.

2 Claims, 6 Drawing Sheets

FOREIGN PATENT DOCUMENTS

| | | |
|---|---|---|
| JP | 2002-299755 | 10/2002 |
| JP | 2003-298184 | 10/2003 |
| JP | 2004-198435 | 7/2004 |

OTHER PUBLICATIONS

Great Britain Search Report for corresponding Application No. 0519799.1 dated Nov. 29, 2005.

International Search Report for corresponding PCT Application No. PCT/GB2006/050302 mailed Mar. 16, 2007.

Form PCT/ISA/237 for corresponding PCT Application No. PCT/GB2006/050302 dated Mar. 16, 2007.

Li Xia et al.; "Custom design of large chirped Bragg gratings on application of gain flattened filtering"; APOC 2003: Asia-Pacific Optical and Wireless Communications. Optical Fibers and Passive Components; Nov. 4-6, 2003; Wuhan, China; vol. 5279, No. 1, 2004, pp. 85-88; XP002411301.

M. Rochette et al.; "Gain Equalization of EDFA's with Bragg Gratings"; IEEE Photonics Technology Letters; IEEE Service Center, Piscataway, NJ; vol. 11, No. 5, May 1999, pp. 536-538; XP000830410.

Ivan A Avrutsky et al.; "Multiwavelength Diffraction and Apodization Using Binary Superimposed Gratings"; IEEE Photonics Technology Letters; IEEE Service Center, Piscataway, NJ; vol. 10, No. 6, Jun. 1998; XP011046068.

Japanese Application No. 2008-532883 Office Action (Nov. 22, 2011) (English translation submitted).

\* cited by examiner

BRAGG GRATING STRUCTURE

This application is a divisional application of U.S. patent application Ser. No. 12/088,136 filed on Mar. 26, 2008, which is a §371(c) of International Application No. PCT/GB2006/050302, filed Sep. 22, 2006, and also claims priority to British Application No. 0519799.1 filed on Sep. 29, 2005, the entire disclosures of which are incorporated herein by reference.

The present invention relates to a Bragg grating structure. In particular, although not exclusively, the invention relates to a modified Bragg grating structure for use in a tunable laser to facilitate the production of a level modal gain.

It will be understood that the terms "optical" and "optoelectronic" are used in this specification in a non-specific sense, that is so as to cover use with radiation in the visible and non-visible parts of the spectrum, and so as not to be limited to use with visible light. Similarly, it will be understood that use of the term "light" may apply to electromagnetic radiation of any frequency, and is not limited to light in the visible spectrum. Further it will be understood that the use of the term "waveguide" describes a structure that guides light and which may comprise a plurality of layers.

Tunable lasers are important for a number of applications in optical telecommunications and signal processing applications. The design and operation of tunable lasers is described, for example, in the article "Tunable Laser Diodes" by Markus-Christian Amann and Jens Buus (ISBN 0890069638). An exemplary design of tunable laser comprises a gain region bounded at one end by a reflector in the form of a Distributed Bragg Reflector (DBR) adapted to reflect a range of wavelengths (often known as a chirped grating), and at the other end by a DBR adapted to reflect a "comb" spectrum of discrete wavelength peaks.

Further designs of tunable laser are possible: U.S. Pat. No. 5,838,714 describes a three section DBR laser in which the DBR is segmented and composed of a repeating chirped pattern, with interdigitated electrodes connected such that each segment of grating is electrically connected in parallel with all other comparable sections. Thus it is electrically equivalent to a single chirped segmented grating, but optically will have more uniform attenuation of all wavelengths (due to the lossy nature of the grating).

U.S. Pat. No. 5,379,318 describes a tunable laser in which two segmented DBRs, one on either side of a gain section, are used that each produce a comb-like reflection spectrum, and the two spectra have interleaved peaks, such that an individual peak from one segment can be tuned to overlap that of a peak in the other DBR, in order to create and define an optical cavity that is above the lasing threshold.

Distributed Bragg gratings are commonly found in optical fibres and semiconductor optical devices. Such gratings in optical fibres are known as "Fibre Bragg Gratings" (FBGs) and those in semiconductor optical devices as "Distributed Bragg Reflectors" (DBRs).

In its simplest form, a Bragg grating comprises a periodic modulation of the refractive index of a waveguide. Light is scattered at each change in refractive index. If the Bragg condition is satisfied, the light reflected at each of the grating planes interferes constructively. The Bragg condition is defined as $\lambda_B = 2 n_{eff} \Lambda$, where $\lambda_B$ is the wavelength of the incident light, $n_{eff}$ is the effective refractive index of the waveguide, and $\Lambda$ is the pitch of the modulation. A grating of constant pitch and reflective strength thus produces a reflection of light of a wavelength of twice the effective pitch of the grating, where the effective pitch differs from actual pitch by a factor of $n_{eff}$. Where DBRs are provided in a semiconductor waveguide, the grating is typically formed by etching a lithographic pattern in a chemical resist into the structure, part of the way through epitaxial growth, and then overgrowing with a material of different refractive index. The lithographic patterns may be written holographically using an optical interference pattern, photolithographically by exposing through a mask onto a light sensitive resist (photoresist), or by electron-beam ("e-beam") lithography using e-beam sensitive resist.

Bragg gratings can also be adapted to reflect a range of wavelengths, and these are known as chirped gratings. The pitch $\Lambda$ of a chirped grating varies along the length of the grating, commonly monotonically, as shown schematically in FIG. 1. A chirped grating of constant reflective strength should produce a reflection spectrum (reflectivity plotted against wavelength) in the shape of a "top hat", i.e. the reflection of the grating is substantially uniform within a specific wavelength range, as shown in FIG. 2. Chirped gratings are often incorporated into tunable semiconductor lasers as a reflector at one end of the gain region of the laser, and an example is shown in WO 03/012936. Further examples may be seen in U.S. Pat. No. 6,771,687, which provides an example of how FBGs may be used in an FBG stabilised laser, and U.S. Pat. No. 6,345,135, which illustrates applications of DBRs in semiconductor optoelectronic devices.

The reflector at the other end of a tunable laser may be arranged to produce a "comb" of reflective peaks at discrete wavelengths, as shown in FIG. 3. This comb-like spectrum can be produced by a segmented grating with a stepped pitch—i.e. a series of discrete grating segments, each of different pitches.

An alternative form of comb grating is known as a "sampled grating" and an example is shown schematically in FIG. 4. The DBR comprises a repeating pattern of units 1, 2, 3, each unit comprising a constant pitch grating 4, 5, 6 followed by a region 7, 8, 9 from which the grating is absent. Sampled gratings are described, for example, in Amman and Buus (ISBN 0890069638—mentioned above) and U.S. Pat. No. 6,141,370. The grating-less regions 7, 8, 9 are much greater in length than the grating period $\Lambda_1$. DBRs of this form produce a comb of reflection peaks with a $sinc^2$ envelope function, i.e. the envelope function is peaked at a central maximum, falling away at the sides, such that reflective peaks away from the centre of the operating range typically have a weaker reflection, as shown in FIG. 5. The shape of these DBRs makes it difficult to operate two of them together with different peak spacings in a Vernier manner, as described in U.S. Pat. No. 4,896,325.

The sampled grating can be modified to produce a flat topped comb-like reflector (as shown in FIG. 3) by replacing the constant pitch gratings in each unit by chirped gratings, as described in U.S. Pat. No. 5,325,392 and U.S. Pat. No. 6,141,370. Such gratings are known as "superstructure gratings" or "periodically chirped gratings". More complex non-binary superstructure gratings are also known.

Another DBR that produces a comb-like reflection spectrum is known as a "phase change grating" and an example is shown in FIG. 6. Such a grating typically comprises sections of constant pitch grating 10-15 separated by phase changes 16 of π radians, and by careful design can produce a comb of reflection peaks within a substantially flat topped envelope function, as explained in U.S. Pat. No. 6,345,135. Such gratings require complex computer modelling and optimisation, and are considered to be particularly sensitive to design variations.

A further DBR for producing a comb-like structure is known as a "superimposed grating" and an example is shown in FIG. 7 and described in U.S. Pat. No. 3,141,370. The grating consists of an array of segments, each segment being of equal length s, in which are defined periods Λ=p.s, (p+1).s, and (p−1).s. The choice of different elements introduce corresponding phase shifts of 0, φ=+πs/Λ and φ=−2πs/Λ.

Thus DBRs for use in tunable lasers are generally designed to produce one of three types of reflection spectrum: the "top hat" of FIG. 2 produced by a chirped grating; the comb of FIG. 3 with uniform peak heights produced by some stepped segmented gratings and phase change gratings; and the comb modulated by a $sinc^2$ function of FIG. 5 produced by a sampled grating.

The light produced by the active medium in the gain section of a semiconductor laser exhibits a characteristic spectral profile that is usually peaked, and the materials of the laser are typically chosen such that the peak lies within the operating range of the laser. However, this peaked shape is disadvantageous in a tunable laser when it is operated away from the wavelength of the peak. The shape of the gain band is usually roughly parabolic, and the gain is reduced at the highest and lowest wavelengths. The usable tuning range of the laser is thus limited by the low gain at these wavelengths. It has in the past been attempted to overcome this problem by altering the active medium to "flatten" the gain band but implementation of this is difficult.

In accordance with one aspect of the present invention there is provided a chirped Bragg grating having a local reflection strength which varies with position along the length of the grating so as to generate an overall reflection strength spectrum which is non-uniform with respect to wavelength between two wavelength extremities. The non-uniform reflection strength of the chirped Bragg grating may then be used to compensate for the non-uniform shape of the gain profile of the gain section of a tunable laser, or for other optical cavity losses.

A typical chirped grating comprises a periodic pattern of marks and spaces whose period varies along the length of the grating. In a preferred embodiment the grating comprises one or more reduced reflective strength regions, each formed by the base order periodic pattern of marks and spaces from which at least some of the marks are missing. This enables the local reflective strength to be controlled without the need to change the grating amplitude or the mark:space ratio, which is a particularly useful feature for gratings manufactured by e-beam lithography. The pattern in each of the reduced reflective strength regions is preferably defined by the base order pattern modulated by a higher order envelope function that determines which marks are missing from the base order pattern.

Alternatively, the local reflection strength along the length of the grating may be varied by changing the mark width:space width ratio along the length of the grating, or by varying the difference in refractive index between marks and spaces.

The reflection strength of the grating is preferably higher for wavelengths at the extremities of the reflection spectrum than for wavelengths between these extremities. This enables the grating to be used to compensate for the parabolic gain profile typically found in the gain section of tunable semiconductor lasers. Thus the reflection spectrum may have a "dished" profile, which may be symmetric or asymmetric. Alternatively the reflection strength of the grating may increase, possibly linearly, from one wavelength extremity to the other wavelength extremity. As a still further alternative, the "dished" profile may be combined with an underlying rising trend between the wavelength extremities.

In accordance with another aspect of the present invention there is provided a Bragg grating adapted to produce a reflection spectrum comprising a comb of reflective peaks at discrete wavelengths, the peaks having reflection amplitudes modulated by a non-uniform envelope function between two wavelength extremities, the grating comprising a plurality of periodic grating sections separated by phase changes, the lengths of the grating sections being chosen so that the envelope function includes maxima at the two wavelength extremities. Preferably the envelope function is dish shaped.

Thus a comb grating having a non-uniform reflection spectrum may be used instead of (or in addition to) a chirped grating to compensate for the non-uniform shape of the gain profile of the gain section. The optimisation of section lengths enables other envelope functions to be chosen if necessary, to compensate for different shapes of gain profile or optical cavity losses. In one embodiment, each phase change between sections is of π radians.

The envelope function may be asymmetric, and this is preferably achieved by choosing the position and size of the phase changes between grating sections to control the asymmetry of the envelope function. For an asymmetric reflection spectrum the phase changes are preferably different from π radians.

Other types of comb grating may also be used as compensating reflectors in a tunable laser. Thus in accordance with another aspect of the present invention there is provided a Bragg grating adapted to produce a reflection spectrum comprising a comb of reflective peaks at discrete wavelengths, the peaks having reflection amplitudes modulated by an envelope function, the grating comprising a plurality of periodic grating sections, each having a different pitch, wherein the relative reflective strength of the grating sections is varied with position along the length of the grating to control the envelope function. The envelope function of the reflection spectrum is preferably higher at the wavelength extremities than between these extremities.

In accordance with another aspect of the present invention there is provided a tunable laser comprising a gain section bounded at each end by a reflector, the gain section having a non-uniform wavelength gain profile, wherein at least one of the reflectors is a Bragg grating as described above. The reflection spectrum of the grating has an amplitude envelope function adapted to vary with wavelength in an opposite fashion to the gain profile so as to compensate at least partially for the non-uniform gain profile. The reflection spectrum of the at least one reflector preferably exhibits higher reflection at the wavelength extremities than between these extremities so as to compensate for a gain profile higher in the middle than at the edges.

One of the reflectors may be a chirped reflector adapted to reflect a continuous range of wavelengths. The other reflector may be a comb reflector adapted to produce a comb of reflective peaks, and the comb reflector may be adapted instead of (or as well as) the chirped reflector as the compensating reflector.

In some tunable lasers (for example a Vernier tuning laser), both reflectors are comb reflectors adapted to reflect a range of reflective peaks. In such lasers either or both comb reflectors may be used to compensate for the non-uniform gain profile.

In accordance with a further aspect of the invention there is provided a method of manufacturing a chirped Bragg grating having a non-uniform wavelength reflection spectrum, the method comprising varying the reflection strength along the length of the grating.

In accordance with a yet further aspect of the invention there is provided a method of increasing the usable tuning range of a tunable laser having a gain section bounded at each end by a reflector, at least one of the reflectors being a Bragg reflector as described above, the gain section having a non-uniform wavelength gain profile, the method comprising at least partially compensating for the non-uniform gain profile by adapting the Bragg reflector so that its wavelength reflection spectrum has an amplitude envelope function which varies with wavelength in an opposite fashion to the non-uniform gain profile.

Some preferred embodiments of the invention will now be described by way of example only and with reference to the accompanying drawings, in which.

Figure 8:
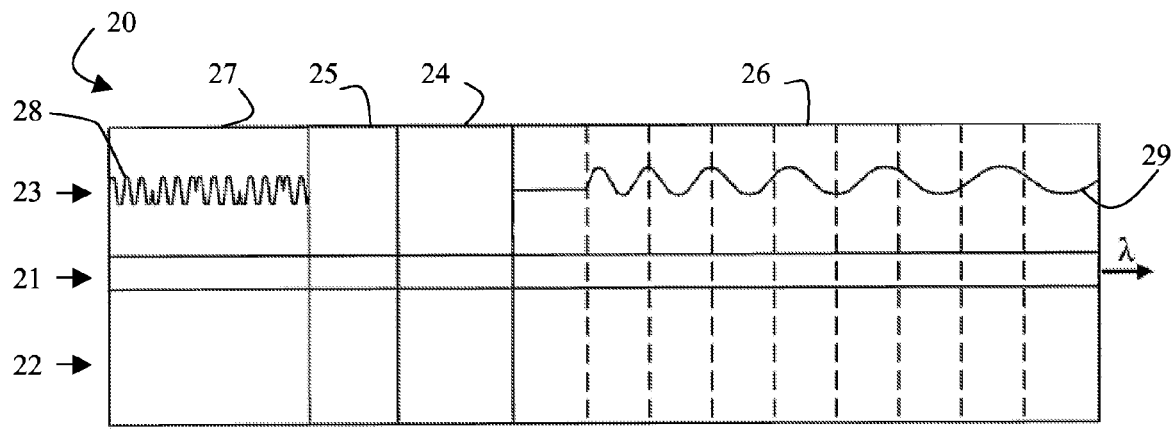
FIG. 8 is a schematic representation of a tunable laser.

FIG. 8 is a schematic representation of a typical tunable laser 20, of the type described in WO 03/012936. As is conventional, the laser is built up in a series of layers, with a waveguide layer 21 bounded by a lower layer 22 and upper layer 23. The structure may include further layers, but they are not material to the invention and are not shown for clarity.

Figure 1:
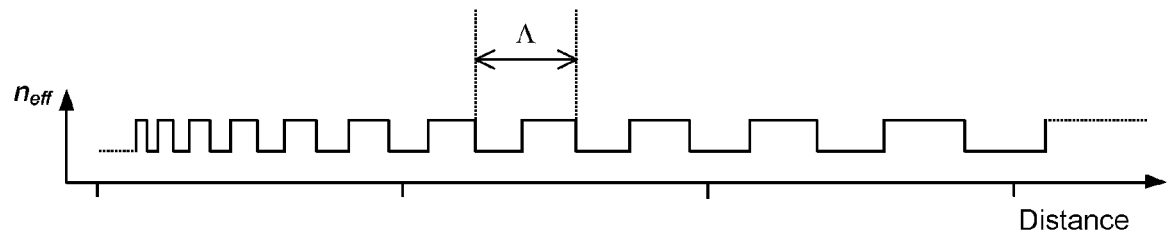
FIG. 1 is a schematic representation of a chirped Bragg grating.
Figure 2:
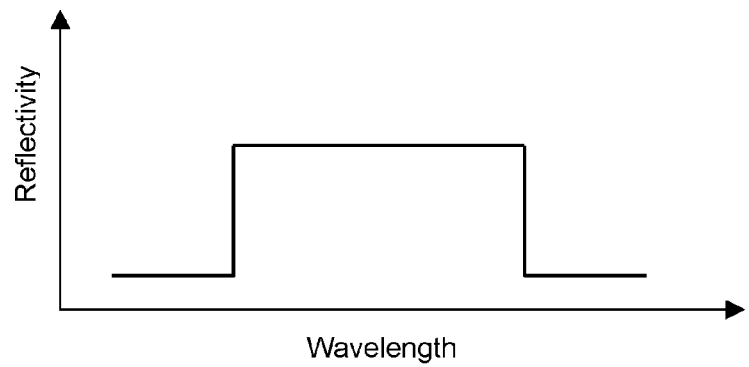
FIG. 2 is a graph showing the schematic reflection spectrum of the grating of FIG. 1.
Figure 6:
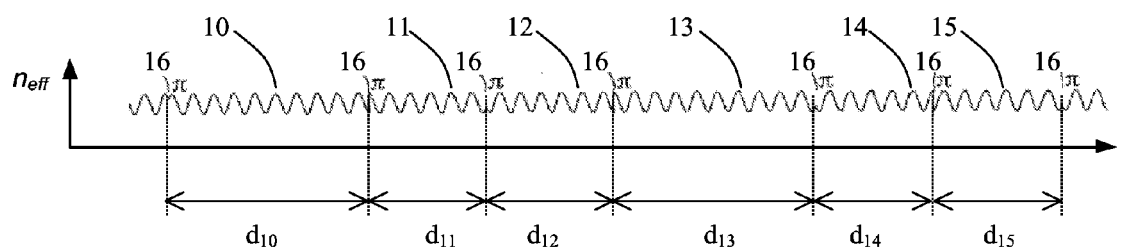
FIG. 6 is a schematic representation of a Bragg phase change grating.
Figure 7:
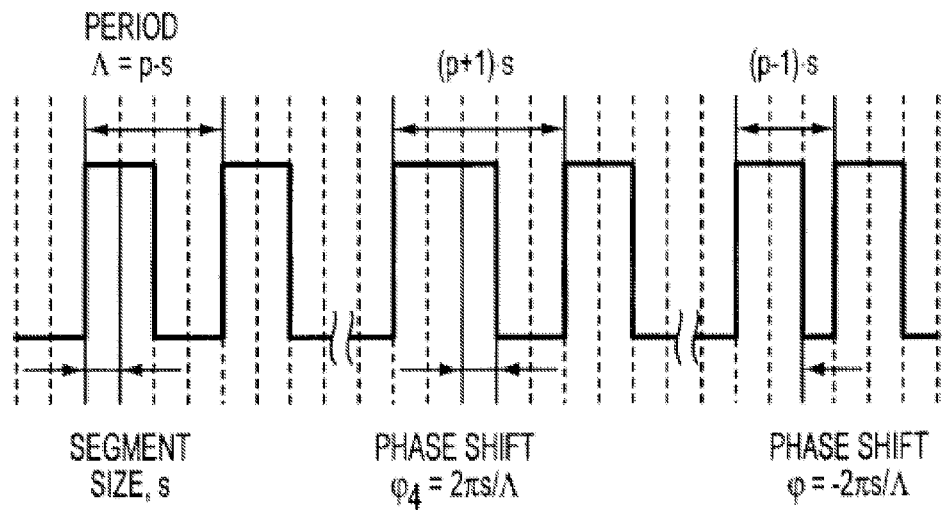
FIG. 7 is a schematic representation of a binary superimposed grating.

The laser 20 has four principal sections: a gain section 24, a phase change section 25 and front and rear reflecting sections 26, 27. The rear reflecting section 27 has a phase change grating distributed Bragg reflector 28 (similar to that shown in FIG. 6) formed in the upper layer 23. This reflector produces a comb of reflectance peaks at separated wavelengths. The front reflecting section 26 consists of a linearly chirped grating 29 of progressive pitch variation along the length. It will be noted that the chirped reflector of FIG. 8 is represented as a sinusoidal variation in refractive index, whereas the chirped reflector previously shown in FIG. 1 is castellated. The physical shape depends largely on the manufacturing method used to produce the grating. Both types of grating work in a similar manner and for the present invention may be considered to be interchangeable.

The laser operates by injecting sufficient current into the gain section 24 to create a population inversion of charge carriers, and by making a portion of the front grating 26 reflect light of a specific wavelength preferentially, so that the rear grating 27 selectively reflects light of that particular wavelength. The front grating will reflect back the light at that wavelength, so that the wavelength will become the preferred or enhanced wavelength and the laser will start to laser at that wavelength. The mechanism by which a preferred wavelength is selected is well known and described, for example, in WO 03/012936 and will not be reproduced here.

The gain section 24 can support lasing at a range of wavelengths, but does not provide uniform gain across that range. A gain section in a typical tunable laser has a gain wavelength profile which is approximately parabolic, with a maximum within the operating wavelength range of the tunable laser. At the edges of the gain profile the gain falls off until it is too low for lasing, and this limits the useful tunable operating range of the laser.

Figure 9:
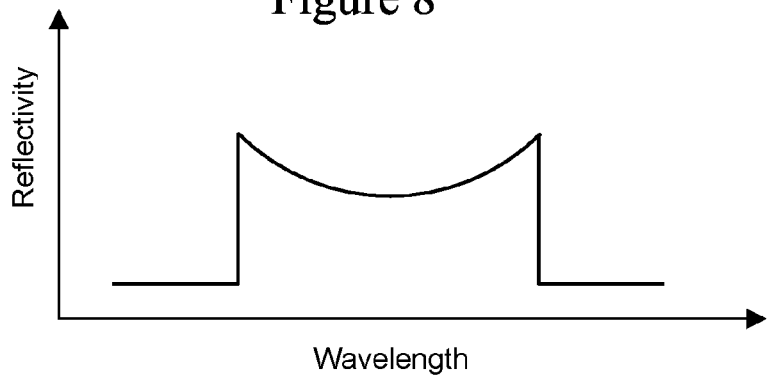
FIG. 9 is a graph showing a dished reflection spectrum of a chirped Bragg grating.

In order to compensate for this parabolic gain, one or both of the reflectors 26, 27 are provided with a "dished" reflection spectrum, so that the reflectivity at the ends of the range is higher than between these ends, as shown in FIG. 9. Either the chirped grating 29 or the phase change grating 28 (or both) may be dished in this manner and each is discussed in turn. Such dishing has the technical advantages of enhancing performance of lasing modes at the extremities of the tuning range and producing a flatter power spectrum for a fixed gain current or a reduction in the gain current budget of the tunable laser.

A monotonically chirped grating can be given a dished reflection spectrum by producing a non-uniform local reflection strength along the length of the grating, such that the grating region of intermediate pitch is of lower reflection strength than the extremities of the range of pitches. The reflection strength in the central region can be reduced in a number of different ways.

Figure 10:
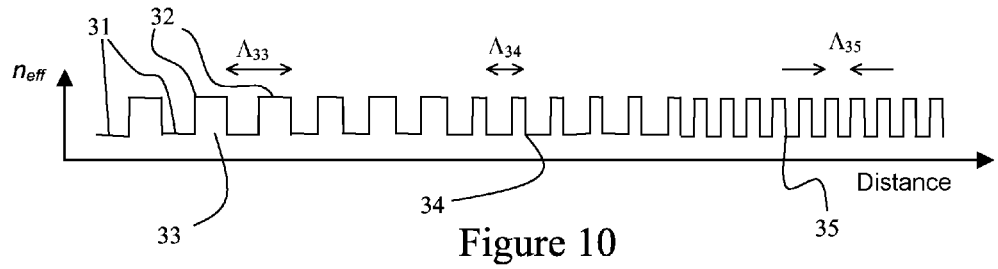
FIG. 10 is a schematic representation of one embodiment of a chirped Bragg grating capable of producing a dished reflection spectrum.

For a direct-write holographic grating (written directly into the material, as per a fibre Bragg grating), the relative height of the refractive index peaks and troughs may be reduced. Alternatively, the mark:space ratio may be changed. An example of a dished chirped grating of this type is shown in FIG. 10. The grating 30 comprises a series of spaces 31 and marks 32 with higher refractive index. The grating is divided into regions 33, 34, 35 having decreasing pitch $\Lambda_{33}$, $\Lambda_{34}$, $\Lambda_{35}$. In the end regions 33, 35, the widths of the marks and spaces are approximately equal (i.e. the mark:space ratio≈1). In the central region 34 the marks 32 are substantially narrower than the spaces 31 (i.e. the mark:space ratio≈0.25). As is well known, the reflective strength of a section of grating is controlled by the mark:space ratio, and for a first order grating is higher when this ratio is close to 1. Thus for the grating 30, the reflective strength of the central region 34 (and thus the central wavelengths) is lower than for the outer regions 33, 35 (and thus the outer wavelengths). Thus the grating 30 shown in FIG. 10 will have a reflection spectrum similar to that shown in FIG. 9.

There are occasions where variation in mark:space ratio is not desirable. Away from a mark:space ratio of 1 (for a first order grating) it can be difficult to manufacture the grating and it may be vulnerable to manufacturing variations. In such situations it may be desirable to reduce the strength of portions of a grating using a "deleted marks" approach. This approach is particularly suitable for gratings written by e-beam lithography and is described in detail in British patent no. 2418995. A brief explanation is also given with reference to FIGS. 11A to 11C.

Figure 11A:
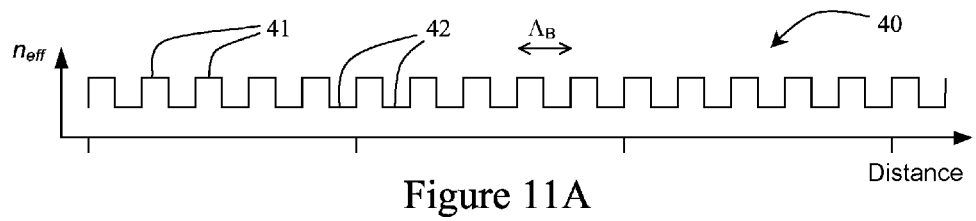
FIGS. 11A to 11C are schematic representations of a grating region showing how the local reflection strength can be reduced by mark deletion.

FIG. 11A is a schematic diagram of a section of grating 40 comprising a plurality of marks 41 separated by spaces 42, with a pitch $\Lambda_B$. The grating section 40 may form part of a larger chirped grating, but over the distance shown in FIG. 11A the pitch $\Lambda_B$ does not change appreciably. The mark:space ratio of this grating section 40 is 1:1 and the grating is first order (with respect to light in the waveguide).

Figure 11B:
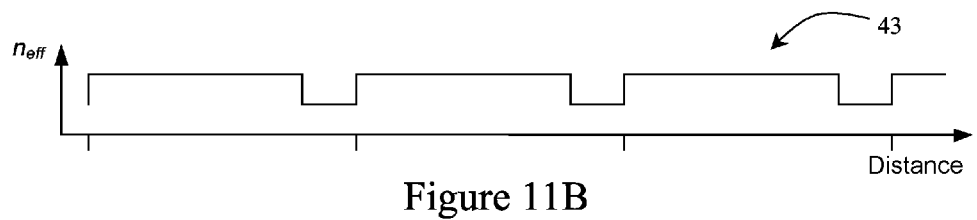
Figure 11C:
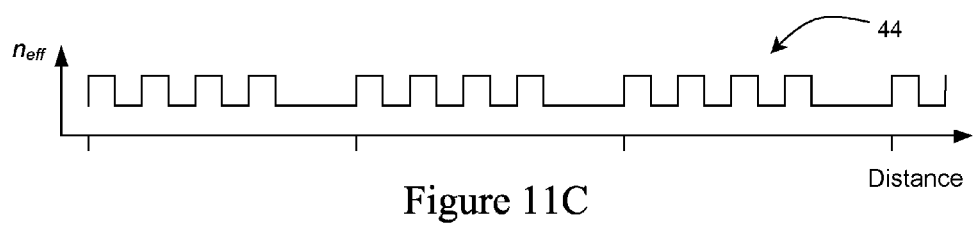

FIG. 11B shows a fifth order binary envelope function 43 which is used to modulate the grating section 40, such that every fifth mark 41 of the first order grating is 'deleted' to produce a new grating section 44, as shown in FIG. 11C. This produces a grating section 44 with a lower reflectivity than the complete first order grating section 40. It may be visualised either as a first order grating section with every fifth mark deleted, or as a combination of a first order and a fifth order pattern. Other higher order envelopes may also be applied to the first order grating 40 to reduce the reflectivity still further, for example by deleting two, three or four marks out of every five, or by using a different order grating as the higher order grating.

Figure 12:
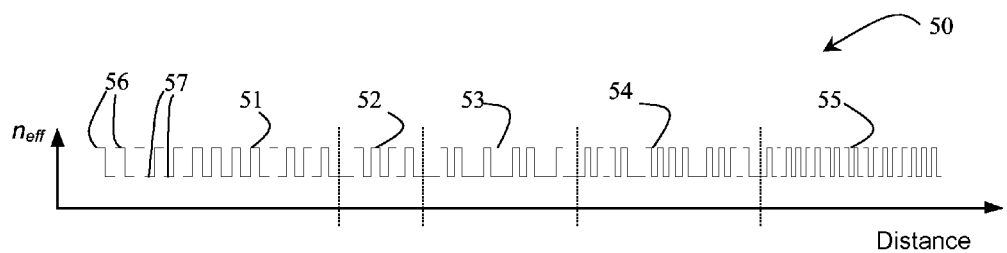
FIG. 12 is a schematic representation of another embodiment of a chirped Bragg grating capable of producing a dished reflection spectrum grating.

FIG. 12 shows schematically a chirped grating 50 which has been dished using the deleted marks approach. The grating is formed in sections 51 to 55 with decreasing pitch along its length. In the outer regions 51, 55 the marks 56 and spaces 57 form a base order pattern with a mark:space ratio of 1:1. The regions 52, 54 immediately inside these outer regions have one mark in every five deleted, and thus exhibit a lower reflective strength than the outer regions 51, 55. The central region 53 has had three marks out of every five deleted, and thus has a lower reflective strength still. The overall wavelength reflection spectrum thus resembles that shown in FIG. 9.

Figure 13:
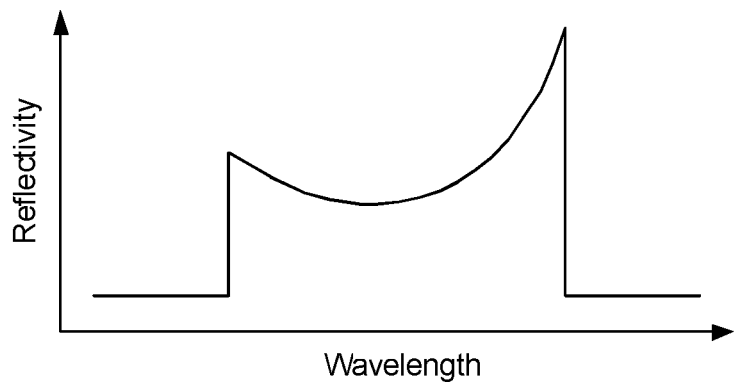
FIG. 13 is a graph showing an asymmetric dished reflection spectrum of a chirped Bragg grating.

Of course, the non-uniform gain profile of the gain section 24 of the laser may not be symmetric. It is possible to adjust the reflection spectrum of the chirped reflector to compensate for this by choosing the local reflection strength along the length of the grating to control the shape of the dishing of the reflection spectrum. It is therefore possible to produce a grating with an asymmetric reflection spectrum, as shown for example in FIG. 13.

As mentioned previously, the phase change grating 28 acting as the rear reflector 27 may also be modified to compensate for the non-uniform gain profile of the gain section 24. This modification may be instead of or in addition to the dishing of the chirped grating 29 described above. The reflection spectrum of the comb grating should be modified by a dished envelope function. This can be seen in FIG. 14, which is a schematic graph showing the reflection profile 60 of a dished comb grating. The spectrum comprises a plurality of peaks 61-68 at discrete wavelengths, but the reflection of the outermost peaks 61, 68 is higher than the reflection of the inner peaks 64, 65, 66.

Figure 3:
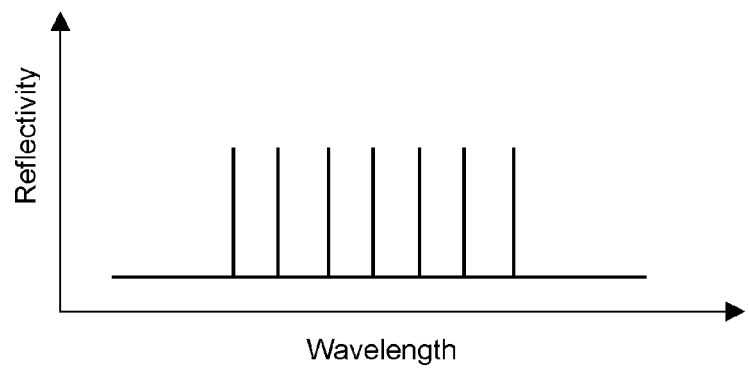
FIG. 3 is a graph showing a schematic reflection spectrum of a Bragg comb grating.
Figure 4:
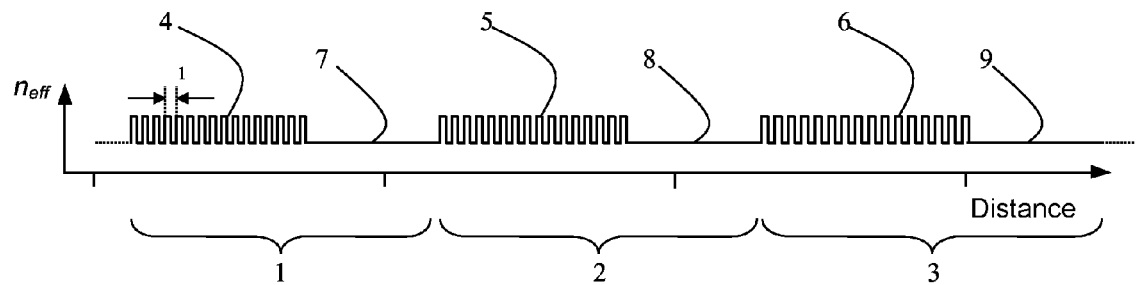
FIG. 4 is a schematic representation of a sampled Bragg grating.
Figure 5:
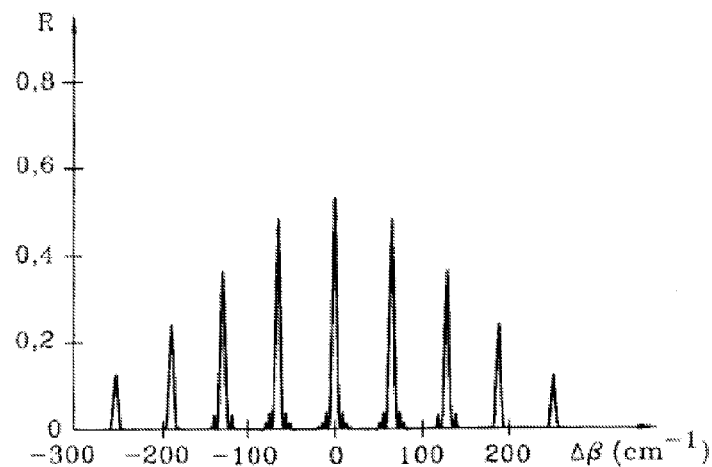
FIG. 5 is a graph showing the reflection spectrum of the grating of FIG. 4.
Figure 14:
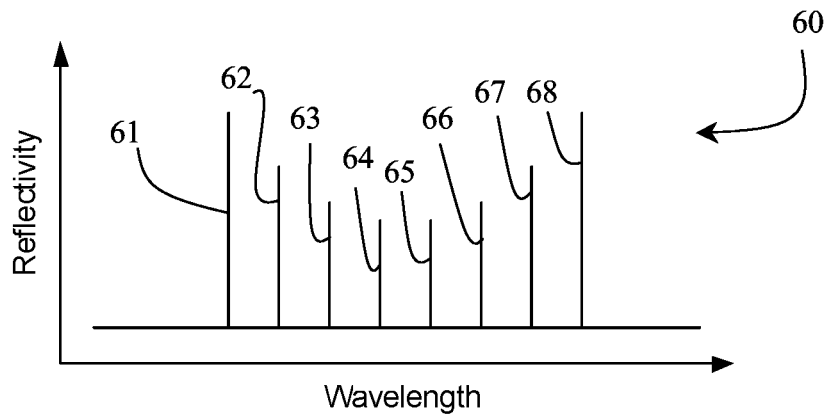
FIG. 14 is a graph showing a schematic reflection spectrum of a Bragg comb grating with a dished envelope function.
Figure 15:
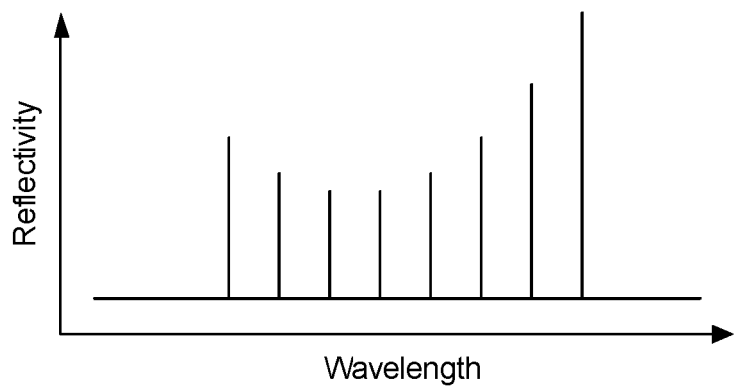
FIG. 15 is a graph showing a schematic reflection spectrum of a Bragg comb grating with an asymmetric dished envelope function.

Referring back to FIG. 6, it has been found that it is possible to optimise the distances $d_{10}$-$d_{15}$ between the $\pi$ phase changes 16 so as to change the shape of the reflection spectrum from a flat-topped comb (as shown in FIG. 3) to a dished comb 60 as shown in FIG. 14. This optimisation requires complicated computer modelling In addition, by modifying the phase changes to be other than $\pi$ it is possible to further modify the shape of the dished comb reflection spectrum to provide asymmetry, as shown in FIG. 15. As mentioned above, this is useful where the gain profile is not symmetrical.

It will be appreciated that not all tunable lasers have comb gratings formed by phase change gratings. The rear reflector may instead comprise, for example, a segmented grating or a sampled grating. A segmented grating may be dished in a similar manner to a chirped grating, by varying the reflective strength of individual segments. This may be done by varying the mark:space relative intensity or the mark:space width ratio, or by using the "deleted marks" approach also described above. Similarly, the reflection spectrum of a chirped sampled grating may be dished by controlling the local reflection strengths at different wavelengths.

Figure 16:
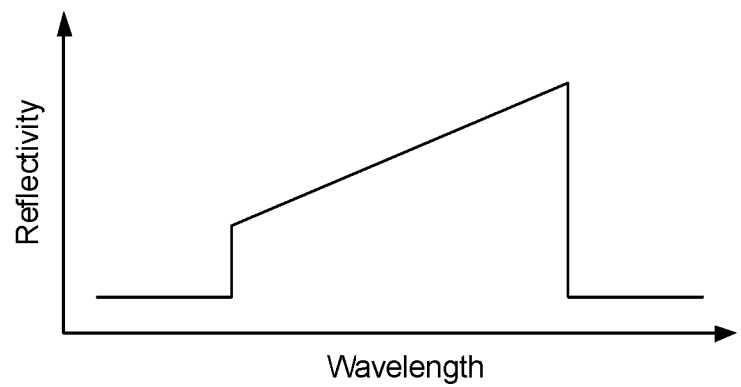
FIG. 16 is a graph showing a schematic linear reflection spectrum of a chirped Bragg grating.
Figure 17:
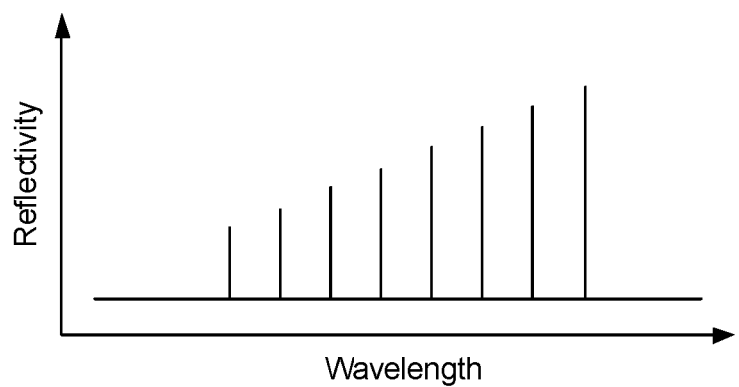
FIG. 17 is a graph showing a schematic reflection spectrum of a Bragg comb grating with a linear envelope function.

Although the embodiments above have been discussed with reference to the non-uniformity of the gain profile, one skilled in the art will recognise that the invention may also be used to compensate fully or partially for other optical non-uniformities in the laser structure, such as non-uniform optical loss within the laser cavity. It may therefore be desirable to provide gratings with other non-uniform, but not necessarily dished, reflection spectra. Examples include asymmetric reflection spectra such as those shown in FIGS. 16 and 17. FIG. 16 is a schematic representation of the reflection spectrum of chirped grating whose reflectivity varies linearly with wavelength. FIG. 17 is a schematic representation of the reflection spectrum of a comb grating having an amplitude envelope function which varies linearly with wavelength.

Such asymmetric gratings may be used to compensate for asymmetric optical cavity losses. For example, a grating induces loss, so light reflected from a part of a grating far away from the gain section experiences more "round-trip" loss than light reflected from a part close to the gain section. It may therefore be beneficial to increase the reflective strength of the part of the grating far from the gain section to compensate. It will also be appreciated that gratings with asymmetric profiles (such as those of FIGS. 16 and 17) may be used in conjunction with dished gratings (such as those shown in FIGS. 9 and 13-15.

It will be appreciated that variations from the above described embodiments may still fall within the scope of the invention. For example, a tunable laser has been described having a comb grating as a rear reflector and a chirped grating as a front reflector, but the invention may equally well be used with other designs of tunable laser. For example, WO 03/012936 describes a laser having a phase change grating as a rear reflector and a segmented grating as a front reflector in addition to the phase change grating/chirped grating laser described above. In this case, the phase change grating or the segmented grating, or both, could be dished to compensate for the gain profile.

Other tunable lasers have phase change gratings as front and rear reflectors and the reflection profiles of such gratings may be dished as described above.

The invention claimed is:

1. A tunable laser comprising a gain section bounded at each end by a reflector, the gain section having a non-uniform wavelength gain profile, wherein at least one of the reflectors is a Bragg grating adapted to produce a reflection spectrum comprising a comb of reflective peaks at discrete wavelengths, the peaks having reflection amplitudes modulated by an envelope function which extends between two wavelength extremities, the grating comprising a plurality of periodic grating sections, each having a different pitch, wherein the relative reflective strength of the grating sections is varied with position along the length of the grating to control the envelope function, the reflection spectrum of the grating having an amplitude envelope function adapted to vary with wavelength between the two wavelength extremities in an opposite fashion to the gain profile so as to compensate at least partially for the non-uniform gain profile.

2. A method of increasing the usable tuning range of a tunable laser having a gain section bounded at each end by a reflector, at least one of the reflectors being a Bragg reflector adapted to produce a reflection spectrum comprising a comb of reflective peaks at discrete wavelengths, the peaks having reflection amplitudes modulated by an envelope function which extends between two wavelength extremities, the grating comprising a plurality of periodic grating sections, each having a different pitch, wherein the relative reflective strength of the grating sections is varied with position along the length of the grating to control the envelope function, the gain section having a non-uniform wavelength gain profile, the method comprising at least partially compensating for the non-uniform gain profile by adapting the Bragg reflector so that its wavelength reflection spectrum has an amplitude envelope function which varies with wavelength between the two wavelength extremities in an opposite fashion to the non-uniform gain profile.

* * * * *